United States Patent [19]

Ohba et al.

[11] 4,167,018
[45] Sep. 4, 1979

[54] MIS CAPACITANCE ELEMENT

[75] Inventors: Kenichi Ohba, Kokubunji; Kazutaka Narita, Kodaira, both of Japan

[73] Assignee: Hitachi, Ltd., Japan

[21] Appl. No.: 771,246

[22] Filed: Feb. 23, 1977

[30] Foreign Application Priority Data

Feb. 25, 1976 [JP] Japan ................................ 51-18961

[51] Int. Cl.$^2$ ............................................ H01L 27/04
[52] U.S. Cl. .......................................... 357/51; 357/42; 357/52; 357/54; 357/86
[58] Field of Search ................... 357/14, 51, 52, 86, 357/41, 23, 42, 54, 59

[56] References Cited

U.S. PATENT DOCUMENTS

| 3,408,543 | 10/1968 | Ono et al. | 357/23 |
| 3,890,635 | 6/1975 | Engeler | 357/23 X |
| 3,953,875 | 4/1976 | Cave et al. | 357/14 X |
| 4,012,764 | 3/1977 | Satonaka | 357/68 |
| 4,019,197 | 4/1977 | Lohstroh et al. | 357/23 |

OTHER PUBLICATIONS

M. A. Polinsky, "Structure For Integrating Two Series Connected Diodes in a Reduced Area", *RCA Technical Notes* No. 742, Jan. 1968.

*Primary Examiner*—James W. Davie
*Attorney, Agent, or Firm*—Craig and Antonelli

[57] ABSTRACT

A MIS capacitance element formed in a semiconductor substrate of p-(or n-) conductivity type comprises an n- (or p-) type well region formed in one principal surface of the semiconductor substrate and a polycrystalline region formed on the surface of the well region through a gate insulator layer. A polar voltage is applied between the well region and the polycrystalline layer so that the well region is forward biased and no carrier channel region is formed in the surface of the well region. The MIS element is particularly suited for use in a complementary MIS IC and provides almost no voltage or field dependency of the capacitance.

25 Claims, 8 Drawing Figures

F I G. 3A
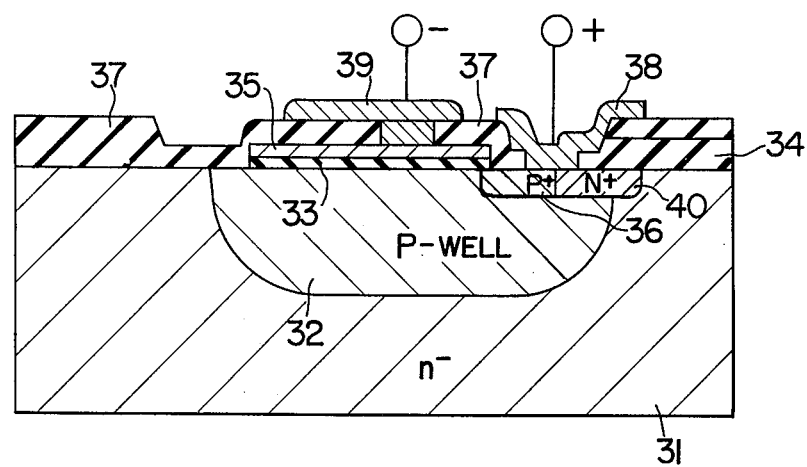
F I G. 3B
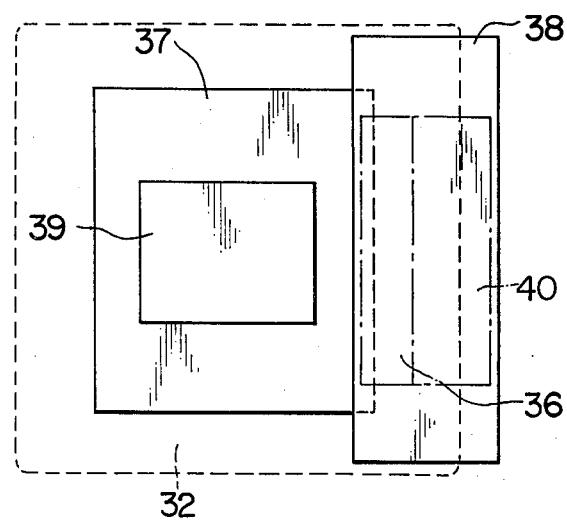

MIS CAPACITANCE ELEMENT

BACKGROUND OF THE INVENTION

1. Field of the Invention

This invention relates to a semiconductor capacitance element and more particularly to a MIS capacitance element adapted for use in a complementary metal-insulator-semiconductor integrated circuit (MIS IC) for a wristwatch.

2. Description of the Prior Art

Conventionally, capacitive elements have been formed in the semiconductor integrated circuit utilizing (a) the MIS gate capacitance using directly the MIS structure which includes the metal-oxide-semiconductor (MOS) structure, (b) the junction capacitance using the diffused layer-substrate junction, and (c) the junction capacitance using the diffused layer-well region capacitance. An example of the MIS capacitance element is proposed by W. G. Pfann and C. G. B. Garrett in Proc. IRE 47, p 2011 (1959). A problem in the MIS capacitance element lies in the property of an insulator-semiconductor interface which tends to collect carriers of one polarity to form a channel region thereunder. A modification of the MIS capacitance element to be integrated into a semiconductor integrated circuit is proposed in Japanese Patent Publication No. 44-30537, in which a metal layer is evaporated on part of the oxide layer formed on a p-type silicon body, the structure is heat-treated at a temperature of 300° C. to 500° C. in a gas atmosphere including hydrogen or moisture and then the unnecessary oxide layer is removed from the silicon surface so as to allow an n-type inversion layer to be formed only in the silicon surface below the remaining oxide layer. In the above capacitances, the voltage is applied in the reverse bias direction and hence the width of the inversion layer or depletion layer formed at the semiconductor surface or the junction interface is varied depending on the applied voltage. Thus, the value of capacitance is also changed. Namely, the capacitance has a voltage or field dependency. For this reason, these capacitive elements cannot be used as stable capacitance elements.

The present inventors have studied the possibilities of obtaining capacitive elements free of field-dependence in the semiconductor integrated circuits. In a complementary silicon gated IC device, the well region, the $p^+$-type (or $n^+$-type) diffused layer, the polycrystalline silicon layer and the aluminium layer can be used as the wiring layer. The present inventors have found that the capacitive element of almost no field dependence can be formed by appropriately selecting one or two from the above-mentioned four wiring materials. Further, particular consideration is paid to the utilization of the gate oxide film from the point of capacitance per unit area.

SUMMARY OF THE INVENTION

Therefore, an object of this invention is to provide a MIS capacitance element free from the field dependence.

Another object of this invention is to provide a MIS capacitance element adapted to be integrated into a complementary MIS IC.

A further object of this invention is to provide a MIS capacitance element suited for use as a load capacitance in a logic gate for setting the time constant of the logic operation large.

According to an aspect of this invention, there is provided a MIS capacitance element to be formed in a semiconductor substrate of a first conductivity type, comprising a well region of a second conductivity type formed in a surface of the semiconductor substrate, a gate insulating film formed on the surface of the well region, and a polycrystalline layer formed on the gate insulating film, the well region and the polycrystalline region serving as the two polar plates of the capacitance element which are to be supplied with a voltage of such a polarity that the well region is forward biased and hence no carrier channel is induced by the voltage application.

In such a MIS capacitance element, since no carrier channel is induced in the well region which serves as one polar plate, the capacitance of the element is not subjected to variation by the change in the applied voltage. When the capacitance has no field dependence, it is easy to design a circuit including such capacitance elements since the time constant is fixed regardless of the applied voltage.

The above and other objects, features and advantages of this invention will become more apparent from the following detailed description of the invention when taken in conjunction with the accompanying drawings.

BRIEF DESCRIPTION OF THE DRAWINGS

FIGS. 3A and 3B are sectional and plan views of another embodiment of this invention respectively.

DESCRIPTION OF THE PREFERRED EMBODIMENTS

Detailed description will be made hereinbelow of the preferred embodiments referring to the accompanying drawings.

Figure 1A:
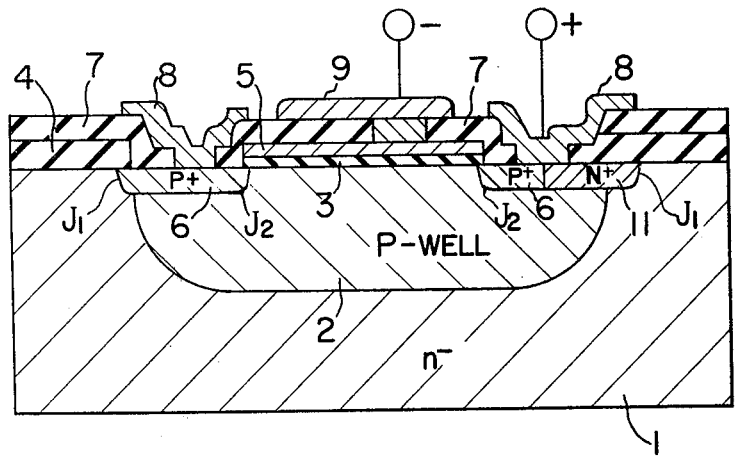
FIG. 1A is a plan view of a fundamental MIS capacitance structure according to an embodiment of this invention.
Figure 1B:
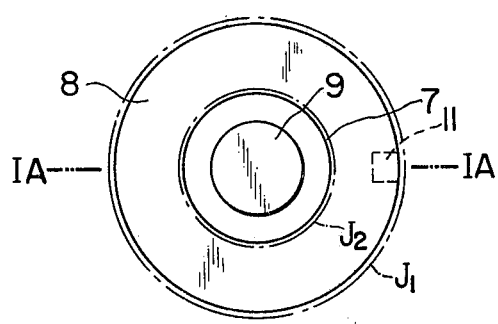
FIG. 1B is a sectional view taken along the line IA—IA of FIG. 1A.
Figure 1C:
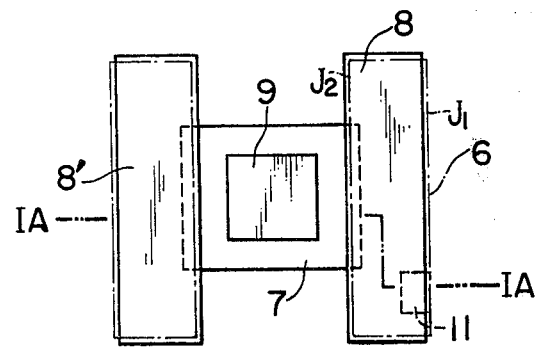
FIG. 1C is an alternative plan view taken along the line IA—IA of FIG. 1A.

FIG. 1A shows a fundamental embodiment of the semiconductor capacitance device according to this invention. In the Figure, numeral 1 denotes a silicon substrate, say of n-type, of a complementary MIS IC chip, 2 a p-type well region formed by ion-implantation of a p-type impurity such as boron, or by the epitaxial growth of p-type silicon layer lightly doped with a p-type impurity formed on a recessed portion which is formed by selective etching. The p-type well 2 is formed by the same steps as those for other p-type wells in which n-channel MIS elements are to be formed. A thin insulator film 3 is formed of the same film for forming the gate region of MIS transistor elements and hence is referred to as the gate insulator film hereinbelow. The gate insulator film 3 may be a thin oxide film having a thickness of about 1200 A, and defined in a predetermined area. The thickness and the area substantially determine the capacitance. A field insulator film 4 for passivating the semiconductor surface may be a thick oxide film, e.g. 1.4 μm thick. A polycrystalline silicon layer 5 is formed and superposed onto the gate insulator film 3 to a thickness of about 0.5 μm, for example by the thermal decomposition of monosilane (SiH$_4$). The polycrystalline layer 5 is doped with n$^+$ or p$^+$-type impurity to have electric conductivity, for example a sheet resistivity of 80 to 150 Ω/□. The impurity doping in the polycrystalline layer 5 is accomplished during a source and drain diffusion step. A p$^+$-type diffused region 6 is formed in the peripheral part of the p-type well region 2 for extracting electrode contacts and has a ring-like shape or a strip shape as shown in FIGS. 1B and 1C. $J_1$ denotes a junction between the n$^-$-type substrate 1 and the p$^+$-type diffused region 6, and $J_2$ denotes a junction between the p-type well 2 and the p$^+$-type diffused region 6.

An n$^+$-type diffused region 11 is formed in a portion of the p$^+$-type diffused region 6 to form a part of junction $J_1$ as shown in FIGS. 1B and 1C, and the p$^+$-type diffused region 6 is connected to the n$^-$-type substrate 1 through an aluminum electrode 8 and the n$^+$-type diffused region 11 and hence grounded. The electrode 8 partially contacts the n$^+$-type diffused region 11. A protective insulator film 7 may be formed of phosphorous silicate glass formed by the chemical vapor deposition (CVD) or of a polyimide-iso-indroquinazolined-ione (polyimid series region), and has windows on those portions where lead-out electrodes make contact with the p$^+$-type diffused region 6 and with the polycrystalline region 5 respectively. The aluminium electrode 8 makes contact with the p-type well region 2 through the p$^+$-type diffused region 6 and another aluminium electrode 9 makes contact with the polycrystalline layer 5, both through respective through-holes formed in the protective insulator film 7 by photoetching technique. The electrode 8 may be formed in a ring shape or a strip shape similar to the p$^+$-type diffused region 6 as shown in FIGS. 1B and 1C.

In the above structure, a capacitor is formed of the p-type well region 2 and the polycrystalline silicon layer 5 sandwiching the gate insulator film 3. The electrode 9 connected to the polycrystalline silicon layer 5 is applied with a negative potential and the electrode 8 connected to the p-type well region 2 is supplied with a positive potential so that a forward bias voltage is applied between the polycrystalline silicon layer 5 and the p-type well region 2, for example, the polycrystalline silicon layer 5 is supplied with $-3$ V to $-6$ V and the p-type well region 2 is maintained at ground potential. Thus, no carrier channel is formed in the well surface.

The area of the polycrystalline layer 5 determines the capacitance with the thickness of the gate insulator film 3.

According to the above embodiments, the objects of this invention as described earlier can be achieved for the following reasons.

(a) The polycrystalline silicon layer and the p-type well region are, even though not perfect, conductors having sheet resistances, e.g. 80 to 150 Ω/□ and 2 to 10 Ω/□, respectively, and hence they constitute a capacitor with the intervening gate insulator film. In the conventional MIS gate capacitors or diffused layer-substrate capacitors, a reverse bias voltage is applied. Thus, they have a field dependence. On the other hand, according to the present invention, a forward bias voltage is applied, so that no inversion layer is formed under the insulating layer. Therefore, there arises no field dependence.

(b) In integrating a capacitor in a MIS device formed on the same IC chip, the gate insulator film for forming a MIS transistor structure can be directly used as the dielectric material isolating the two polar plates. Further, the p-type well region and the polycrystalline silicon gate region are also used directly. Namely, a capacitance element can be formed by heavily doping an impurity of the same conductivity type to that of the well region to form a contact region for the well region, without increasing or requiring particular layer forming processes or mask forming processes. Since the gate insulator film is formed to be very thin, the capacitance formed thereacross becomes large. For example, the capacitance ranges in the order of 2.5 to $3 \times 10^{-4}$ pF/μm$^2$ which is 2 to 3 times as large as the junction capacitance. Here, the polycrystalline silicon layer 5 may be substituted by a refractory metal layer of molybdenum or tungsten.

It is to be noted that this invention is not limited to the above embodiment but can be modified in various ways, as will be seen from the following.

The substrate is not limited to those of n-type. In a p-type substrate, n-type well regions are formed to make p-channel MIS transistors, etc. Sucn n-type wells may be similarly utilized to form MIS capacitance elements. In such a case, it will be apparent that a positive voltage is applied to the polycrystalline layer 5 for forward biasing the well region 2.

Figure 2:
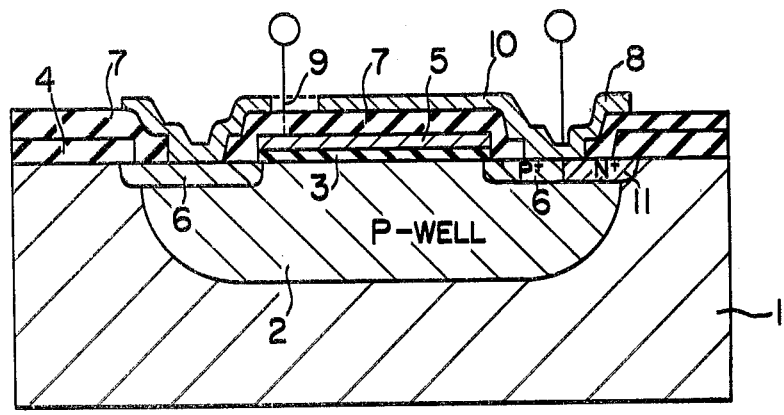
FIG. 2 is a cross section of a MIS capacitance structure according to another embodiment of this invention.

The capacitance may be increased by increasing the area of the polar plate. Namely, FIG. 2 shows a composite MIS capacitor element including a MIS structure and a metal-insulator-metal structure. In this embodiment, a polycrystalline silicon layer 5 extends not only on the gate insulator film 3 but also partially on the field insulator film 4 and an electrode 9 is formed to make contact with the polycrystalline layer 5 at a portion on the field insulator film 4. On the protective Insulator film 7 over the polycrystalline layer 5, an aluminium film 10 is formed in a predetermined shape (square, circular, etc.) so as to cover the polycrystalline silicon layer 5 through the protective insulator film 7 and is connected with the aluminium electrode 8 making contact with the well region 2. The protective insulator film 7 has a larger thickness than the gate insulating layer. Thus, the capacitance is increased in a small amount by the addition of this metal-insulator-metal structure. It will be apparent that the capacitance may further be increased by decreasing the thickness of the insulator layer in this metal-insulator-metal structure.

Figure 4:
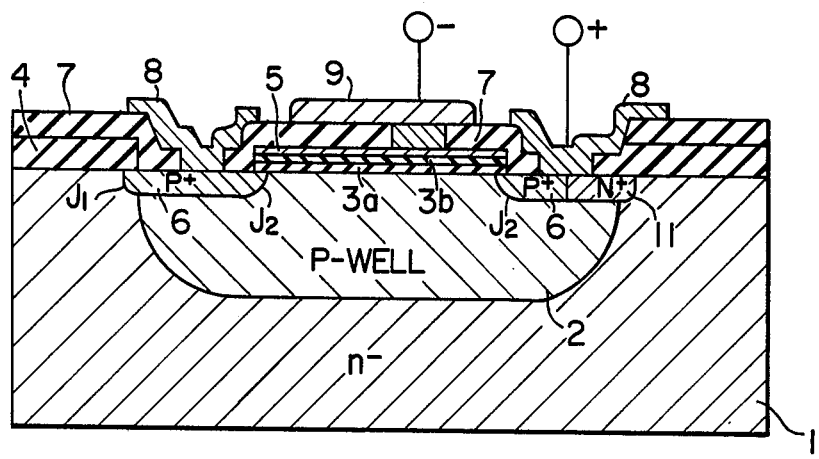
FIG. 4 is a cross-sectional view of a further embodiment of the MIS capacitance element of FIG. 1A.

The gate insulator film may also be formed of a silicon nitride (Si$_3$N$_4$) film or of a double layer of silicon oxide 3$a$ and silicon nitride 3$b$, such as illustrated in FIG. 4.

Figure 5:
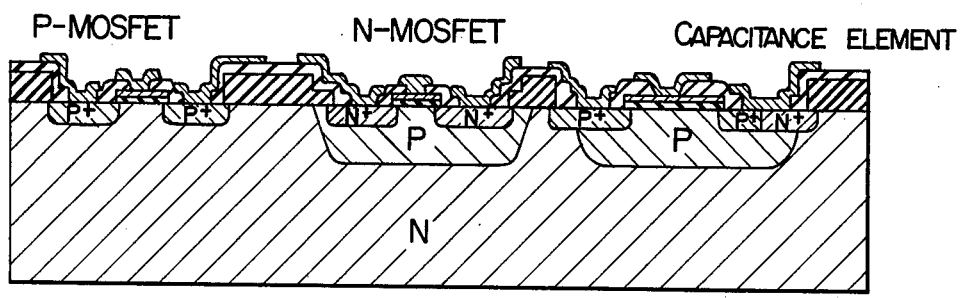
FIG. 5 is a schematic view of a MIS capacitive element of the present invention integrated into a complementary MIS IC.

The present MIS capacitance element is generally usable in complementary MIS ICs where wells of the opposite conductivity to that of the substrate are formed, such as that illustrated in FIG. 5. For example, the electrode connected to the polycrystalline silicon layer may be connected to a fixed operating potential $V_{SS}$ or $V_{DD}$ and the electrode connected to the p-type (or n-type) well is at a varying potential level. Here, the sum of the capacitance between the polycrystalline silicon layer and the p-type well and that between the p-type well and the n-type silicon substrate may be used. In such a case, however, there arises some field dependence since the latter capacitance is an ordinary junction capacitance. The order of the field dependence, as a whole is yet smaller than that of the pure junction capacitance.

FIGS. 3A and 3B show a modification of the MIS capacitor structure of FIG. 1A, in which a p+-type diffused region 36 of bar-like or strip-like configuration is formed to extend along a portion of the outer periphery of a gate insulator film 33. The p+-type diffused region 36 is connected to an n-type substrate 31 through an aluminium electrode 38 and an n+-type diffused region 40. The shape of aluminium electrodes 38 and 39 may be any one other than that in FIG. 3B.

According to the present invention, the gate insulator film may be formed onto the surface of the $n^-$-type substrate. The polycrystalline silicon layer is formed onto the gate insulator film. A capacitor is formed of the $n^-$-type substrate and the polycrystalline silicon layer sandwiching the gate insulator film, not using the p-type well region. In such a case, the polycrystalline silicon layer is supplied with a positive potential and the $n^-$-type substrate is supplied with a negative potential, for example, the polycrystalline silicon layer is supplied with +3 V to +6 V and the $n^-$-type substrate is maintained at ground potential.

We claim:

1. A capacitance element formed in a complementary metal-insulator-semiconductor (MIS) device comprising:

a semiconductor substrate of a first conductivity type;

a well region formed in one principal surface of said semiconductor substrate, and having a second conductivity type opposite to that of said substrate;

an insulator layer having a predetermined thickness and disposed on the surface of said well region;

an electrically conductive layer of doped polycrystalline silicon having a predetermined area and disposed on said insulator layer;

said well region and said conductive layer of polycrystalline silicon serving as opposite polar electrodes of the capacitance element;

a dc voltage being applied between said electrodes with such polarity to prevent generation of an inversion layer in the surface of said well region; and means for electrically connecting said well region to said semiconductor substrate.

2. The capacitance element according to claim 1, wherein said semiconductor substrate is formed of silicon.

3. The capacitance element according to claim 2, wherein said insulator layer is formed by the same insulator film as the gate insulator of the MIS device, and said polycrystalline silicon layer is covered with a protective oxide layer.

4. The capacitance element according to claim 3, wherein said insulator layer is formed of one selected from the group consisting of silicon oxide, silicon nitride and the combination thereof.

5. A capacitance element formed in a complementary metal-insulator-semiconductor (MIS) device comprising:

a semiconductor substrate of a first conductivity type;

a well region formed in one principal surface of said semiconductor substrate, and having a second conductivity type opposite to that of said substrate;

an insulator layer having a predetermined thickness and disposed on the surface of said well region;

an electrically conductive layer of doped polycrystalline silicon having a predetermined area and disposed on said insulator layer;

said well region and said conductive layer of polycrystalline silicon serving as opposite polar electrodes of the capacitance element;

a dc voltage being applied between said electrodes with such polarity to prevent the generation of a voltage-dependent conductive channel in the surface of said well region, a first semiconductor region of high impurity concentration of said second conductivity type formed in at least a peripheral part of said well region in contact with said semiconductor substrate, a second semiconductor region of high impurity concentration of said first conductivity type formed in a part of said first semiconductor region in contact with said semiconductor substrate, and means for electrically connecting said first semiconductor region to said semiconductor substrate through said second semiconductor region.

6. The capacitance element according to claim 5, wherein said first semiconductor region is formed in contact with a portion of the outer periphery of said insulator layer.

7. The capacitance element according to claim 5, wherein said conductive layer is covered with a protective insulator layer through which an electrode is extracted for applying said dc voltage.

8. The capacitance element according to claim 7, wherein said electrode comprises a metal layer disposed on the surface of said protective insulator layer with a part of said metal layer extending to said electrically conductive layer through a through-hole provided in said protective insulator layer.

9. The capacitance element according to claim 7, wherein another electrode is formed of a metal layer extending from the surface of said first semiconductor region of high impurity concentration of said second conductivity type formed in said at least a peripheral part of said well region in contact with said semiconductor substrate, said metal layer covering said protective insulator layer overlying said conductive layer to increase capacitance.

10. The capacitance element according to claim 9, wherein said first semiconductor region has a ring-like shape surrounding a main surface area of said well region beneath said insulator layer.

11. The capacitance element according to claim 9, wherein said first semiconductor region includes a plurality of bar-shaped regions spaced from each other, and said insulator layer covers the surface of said well region between said bar-shaped regions.

12. The capacitance element according to claim 5, wherein said semiconductor substrate is formed of silicon, and said insulator layer is formed of silicon oxide.

13. The capacitance element according to claim 5, wherein said semiconductor substrate is formed of silicon, and said insulator layer is formed of silicon nitride.

14. The capacitance element according to claim 5, wherein said insulator layer is a double layer consisting of a silicon oxide layer and a silicon nitride layer.

15. In a semiconductor integrated circuit device comprising a semiconductor substrate of a first conductivity type, a complementary metal-insulator-semiconductor (MIS) device including a metal-insulator-semiconductor field-effect transistor (MISFET) of a first conductivity channel type formed in one surface of said substrate and a MISFET of a second conductivity channel type formed in the surface of a first well region in the substrate and having a second conductivity type opposite to that of said substrate, and a semiconductor capacitance element formed in the surface of said semiconductor substrate, said semiconductor capitance element comprising:
a second well region formed in said semiconductor substrate at the same time with said first well region, and having the same conductivity type as that of said first well region;
a gate insulator layer having a predetermined thickness and disposed on the surface of said second well region;
an electrically conductive layer having a predetermined area and disposed on said insulator layer;
said second well region and said conductive layer serving respectively as opposite polar electrodes of the semiconductor capacitance element; and
means for electrically connecting said second well region to said semiconductor substrate,
wherein said opposite polar electrodes have a dc voltage applied therebetween with a polarity for preventing generation of a voltage-dependent conductive channel in the surface of said second well region.

16. The capacitance element according to claim 15, wherein said semiconductor substrate is formed of silicon.

17. The capacitance element according to claim 16, wherein said gate insulator layer is formed of the same insulator film as the gate insulator film of said MISFETs, and said conductive layer is covered with a protective oxide layer.

18. The capacitance element according to claim 17, wherein said semiconductor is silicon, and said gate insulator layer is formed of one selected from the group consisting of silicon oxide, silicon nitride and the combination thereof.

19. The capacitance element according to claim 16, wherein said conductive layer is formed of doped polycrystalline silicon.

20. In a complementary metal-insulator-semiconductor (MIS) integrated circuit device comprising a semiconductor substrate of a first conductivity type, a plurality of well regions of a second conductivity type opposite to that of said substrate and formed in one principal surface of said substrate, said well regions being isolated by p-n junctions, a first metal-insulator-semiconductor field-effect transistor (MISFET) of a first conductivity channel formed in at least a first of said well regions, a second MISFET of a second conductivity channel opposite to that of said first MISFET formed in a portion of the principal surface of said substrate exclusive of said well regions, and a MIS capacitance element formed in the principal surface of said substrate, said MIS capacitance element comprising:
an insulator layer formed on the surface of a second of said well regions,
a first electrode formed on said insulator layer, said first electrode and said second well region serving respectively as opposite polar electrodes of said MIS capacitance element, and
a second electrode for short-circuiting said second well region and said semiconductor substrate.

21. The capacitance element according to claim 20, wherein said insulator layer has the same thickness as that of each of said first and second MISFETs.

22. The capacitance element according to claim 21, wherein said first electrode is formed of the same material as that of gate electrodes of said first and second MISFETs.

23. The capacitance element according to claim 21, wherein said insulator layer is formed of silicon oxide, and said first electrode is formed of doped polycrystalline silicon.

24. In a metal-insulator-semiconductor (MIS) type capacitance element having a conductive layer, a semiconductor substrate and an insulator layer interposed between said conductive layer and said semiconductor substrate, the improvement comprising said substrate including a first semiconductor region underlying said insulator layer and being defined by a PN junction with a second semiconductor region of said substrate, a dc voltage being applied between said conductive layer and said first semiconductor region with such polarity to prevent generation in the surface of said first semiconductor region of an inversion layer having a conductivity type opposite to that of said first semiconductor region; and means for electrically connecting said first semiconductor region to said second semiconductor region so as to cause said first semiconductor and second semiconductor regions to have the same potential.

25. A capacitance element comprising:
a semiconductor substrate of a first conductivity type;
a first semiconductor region formed in one principal surface of said semiconductor substrate, and having a second conductivity type opposite to that of said substrate;
an insulator layer having a predetermined thickness and disposed on the surface of said first semiconductor region;
an electrically conductive layer having a predetermined area and disposed on said insulator layer;
said first semiconductor region and said electrically conductive layer serving as opposite polar electrodes of the capacitance element;
a dc voltage being applied between said electrodes with such polarity to prevent generation of an inversion layer having a first conductivity type opposite to that of said first semiconductor region in the surface of said first semiconductor region; and
means for electrically connecting said first semiconductor region to said semiconductor substrate.

* * * * *